United States Patent [19]
Hunt

[11] Patent Number: 5,945,383
[45] Date of Patent: Aug. 31, 1999

[54] METHOD PRODUCING AN SNS SUPERCONDUCTING JUNCTION WITH WEAK LINK BARRIER

[75] Inventor: Brian D. Hunt, Pasadena, Calif.

[73] Assignee: The United States of America as represented by the Administrator of the National Aeronautics and Space Administration, Washington, D.C.

[21] Appl. No.: 07/854,124

[22] Filed: Mar. 19, 1992

[51] Int. Cl.$^6$ ..................................................... H01L 39/24
[52] U.S. Cl. ........................ 505/329; 505/474; 505/190; 505/702; 505/732; 427/62
[58] Field of Search ................. 505/1, 702, 701, 505/732, 329, 190, 474; 427/62, 63, 53.1, 419.3, 596; 257/33, 34

[56] References Cited

U.S. PATENT DOCUMENTS

| | | | |
|---|---|---|---|
| 4,891,355 | 1/1990 | Hayashi et al. | 505/1 |
| 5,034,374 | 7/1991 | Awaji et al. | 505/1 |
| 5,047,390 | 9/1991 | Higashino et al. | 505/1 |
| 5,221,661 | 6/1993 | Housley . | |

FOREIGN PATENT DOCUMENTS 63252316   10/1988   Japan .

OTHER PUBLICATIONS

Dijkkamp et al, Appl. Phys. lett. 51(8), Aug. 1987, pp. 519–520.

B.D. Hunt et al. (Hunt), "All high $T_c$ edge–geometry weak links utilizing Y–Ba–Cu–0 barrier layers," *Appl. Phys. Lett.*, No. 8, pp. 982–984 (Aug. 1991).

J.A. Agostinelli et al. (Agostinelli), "Cubic phase in the Y–Ba–Cu–0 system," 43 *Phys. Rev. B*, No. 13, 11, pp. 396–399 (May 1, 1991).

Wu et al, "Effect of deposition rate on properties of $Y_1Ba_2Cu_3O_{7-\delta}$ superconducting thin films," Appl. Phys. lett. 56(15) Apr. 1990 pp. 1481–1483.

Gao et al, "Controlled preparation of all high–$T_c$ SNS–type edge junctions and DC SQUIDs", Physica C 171 (1990) pp. 126–130 No month data!

Rogers et al, "Fabrication of heteroepitaxial $YBa_2Cu_3O_{7-x}$–$PrBa_2Cu_3O_{7-x}$–$YBa_2Cu_3O_{7-x}$ Josephson devices grown by laser deposition", Appl. Phys. lett. 55 (19) Nov. 1989 pp. 2032–2034.

Krebs et al, "Conditions for oriented growth of Y–Ba–Cu–O and Bi–Sr–Ca–Cu–O films by pulsed laser ablation", J. Appl. Phys. 69(4) Feb. 1991 pp. 2405–2409.

Yoshida et al, "Monolithic device fabrication using high–Tc superconductor", International Electron Devices Meeting (IEDM) (Sanfrancisco, CA) Dec. 11–14, 1988 pp. 282–285.

Koren et al, "Highly oriented as–deposited superconducting laser ablated thin films of $Y_1Ba_2Cu_3O_{7-\delta}$ on $SrTiO_3$, Zirconia, and Si substrates" Appl. Phys. lett. 53(23) Dec. 1988 pp. 2330–2332.

"High Temperature Superconductor Josephson Weak Links," by Brian D. Hunt et al, Electrochemical Society Meeting, Honolulu, Hawaii, May 17–21, 1993 No page data!

"Cubic Phase in the Y–Ba–Cu–O Stystem", Agostinelli et al., Physics Review B 43, p. 11396, (1991) No month data!

*Primary Examiner*—Roy V. King
*Attorney, Agent, or Firm*—John H. Kusmiss

[57] ABSTRACT

A method of producing a high temperature superconductor Josephson element and an improved SNS weak link barrier element is provided. A YBaCuO superconducting electrode film is deposited on a substrate at a temperature of approximately 800° C. A weak link barrier layer of a nonsuperconducting film of N—YBaCuO is deposited over the electrode at a temperature range of 520° C. to 540° C. at a lower deposition rate. Subsequently, a superconducting counterelectrode film layer of YBaCuO is deposited over the weak link barrier layer at approximately 800° C. The weak link barrier layer has a thickness of approximately 50 Å and the SNS element can be constructed to provide an edge geometry junction.

27 Claims, 6 Drawing Sheets

METHOD PRODUCING AN SNS SUPERCONDUCTING JUNCTION WITH WEAK LINK BARRIER

ORIGIN OF THE INVENTION

The invention described herein was made in the performance of work under a NASA contract, and is subject to the provisions of Public Law 96-517 (35 U.S.C. Section 202) in which the Contractor has elected not to retain title.

TECHNICAL FIELD

The present invention is directed to a high temperature superconductor junction produced from a family of rare earth-alkaline earth-cuprate superconductors, and more particularly to an SNS structure having a weak link barrier of a structure compatible with growth on a first superconductor electrode and consistent with providing a good, uniform layer interface for growth of a second superconductor electrode and a method of producing the same.

BACKGROUND ART

The investigation of superconductor devices has been extremely active in recent years because of the potential benefits that can be achieved if their performance and production methods can be made practical for reliable and economical applications in the electronic fields. A tunnel junction and microbridge are the two basic active Superconductor devices which exhibit the ac and dc Josephson effects are required for many applications. Although tunnel junctions fabricated from the conventional, low temperature superconductors have proven to be quite useful, severe surface and interface problems have prevented the successful fabrication of high quality, high temperature superconductor tunnel junctions to date. The extremely short coherence lengths in $YBa_2Cu_3O_{7-x}$, ~2–15 Å, place stringent requirements on the quality of the tunnel barrier material and its interfaces in superconductor-insulator-superconductor (SIS) device structures. These requirements include that the barrier material be extremely thin (~10–20 Å), pin hole free, chemically compatible with the superconductor, and that the superconducting energy gap be fully developed within a coherence length of the interfaces.

The fabrication of high Tc superconductor/normal metal/ superconductor (SNS) microbridges are believed to be less difficult to fabricate than tunnel junctions, due to fewer problems with material interaction and because the normal metal weak link layers can be thicker and hence more easily controllable than the typical tunnel barriers. The stringent requirements for SIS structures are thus somewhat relaxed for SNS structures, though the requirement of high quality interfaces remains. Unfortunately, high quality interfaces are difficult to attain since most metals are reactive with orthorhombic YBaCuO, (o-YBaCuO) and use of a nonreactive Ag or Au makes growth of a high quality of o-YBaCuO counter-electrode difficult due to the mismatch between the o-YBaCuO and Ag or Au crystal lattices.

All high Tc Josephson weak links are potentially useful for high frequency sources and detectors, for high speed, low power digital logic, and for sensitive magnetic field detectors. For optimal performance in these applications, certain device characteristics are desirable, including large (<1 mV) values of the critical current-normal state resistance product ($I_cR_n$) accompanied by strong ac and dc Josephson response, device resistances on the order of 50 Ω, and high critical current densities ($J_c$) for high speed operation. A great deal of effort has been focused on obtaining useful all high Tc Josephson devices with published reports on a wide variety of device structures. The various junction geometries that have been studied include grain boundary weak links as reported in Mannhart et al. "Critical Currents in [001] Grains and Across Their Tilt Boundaries, in $YBa_2Cu_3O_7$ Film", Phys. Rev. Lett. 61, pg. 2476 (1988) and Russek et al. "Scaling Behaviour of $YBa_2Cu_3O_{7-x}$ Thin Film Weak Links", Appl. Phys. Lett. 57, pg. 1155 (1990), all $YBa_2Cu_3O_{7-x}$ step edge microbridges, see Simon et al., "Engineered HTS Microbridges", IEEE Trans. Magnetics 27, pg. 3209 (1991), Au or Ag-coupled microbridges, and epitaxial sandwich or edge-geometry structures using barriers such as $PrYBa_2Cu_3O_{7-x}$, Bn-doped $SrTiO_3$, $Bi_2Sr_2CuO_y$, or $CF_4$ treated $YBa_2Cu_3O_{7-x}$, see Gao et al, "Preparation and Properties of All High $T_c$ SNS-Type Edge DC Squids", IEEE Trans Magnetics 27, pg 3062 (1991), Chin et al., "Novel All-High $T_c$ Epitaxial Josephson Junction", Appl. Phys. Lett. 58, pg. 753 (1991), Mizuno et al., "Fabrication of Thin-Film-Type Josephson Junctions Using a Bi—Cr—Ca—Cu—O/Bi—Sr—Cu—O/Bi—Sr—Ca—Cu—O Structure", Appl. Phys. Lett. 56, pg 1469 (1990), and Koren et al., "Properties of all $YBa_2Cu_3O_{7-x}$ Josephson Edge Junctions Prepared by in situ Laser Ablation Deposition", Appl. Phys. Lett. 58, pg. 634 (1991). Although progress has been made with these devices, their electrical characteristics are often less than ideal with many devices suffering from one or more of the following problems: 1) current-voltage (I-V) characteristics inconsistent with the resistively-shunted junction (RSJ) model; 2) weak magnetic field and microwave response; and 3) low $I_cR_n$ products (<500 μV).

U.S. Pat. No. 4,891,355 discloses a method of producing a superconducting circuit, wherein a laser beam is used to form nonsuperconducting barrier regions between superconducting portions of the film. These barrier regions appear to electrically separate various superconducting parts of the circuit and the dimension of the nonsuperconducting segments will be limited to the dimensions of the laser wavelengths, due to diffraction effects. In essence, a film of a ceramic superconductive material is deposited on a substrate in a superconducting state and then exposed to the laser beam as part of a high temperature heat treatment to turn it into a nonsuperconducting state.

An article "Cubic Phase in the Y—Ba—Cu—O System" by Agostinelli et al., Physics Review B 43, pg. 11396 (1991), discloses a cubic phase of a rare earth-alkaline earth-cuprate film that was deposited as a thin film on a single crystal magnesium oxide substrate by excimer laser ablation.

U.S. Pat. No. 5,034,374 teaches a method of producing a high temperature superconductor element formed from rare earth-alkaline earth-cuprate superconductors with an insulating layer formed between the lower and upper ceramic high temperature superconductor films by an interdiffusion of ceramic superconductors to thereby form a tunnel junction exhibiting Josephson effects.

U.S. Pat. No. 5,047,390 discloses another configuration of a tunnel junction Josephson device.

Finally, the Japanese laid-open patent application No. 63-252316 apparently refers to the deposition of a barrier layer between a substrate and a superconducting material.

The prior art is still seeking to provide an optimum superconducting device exhibiting Josephson effects that can be efficiently manufactured with high yield.

STATEMENT OF THE INVENTION

The present invention discloses a method of providing a high temperature superconductor Josephson element and a novel Josephson element having a weak link barrier layer of a non-superconducting film in a family of rare earth-alkaline earth-cuprate superconductors. An appropriate substrate, such as $LaAlO_3$, is prepared and a film layer of $YBa_2Cu_3O_{7-x}$ is deposited as a base electrode on the substrate by a pulsed excimer laser ablation technique in a vacuum chamber with an oxygen environment of approximately 100–200 m Torrs. The backing plate temperature was approximately 790°–830° C. during the growth of the base electrode superconducting layer. The base electrode layer is annealed in 50–100 Torrs of oxygen for approximately 12 minutes at about 500° C. Subsequently, a thick insulating layer, such as magnesium oxide was deposited and patterned by a photolithography and lift-off process. The magnesium oxide layer was utilized as an ion milling mask to define a self-aligning edge in the base superconductor electrode. An ion milling and cleaning step created an edge in the base superconductor electrode. A weak link barrier layer of a nonsuperconducting film of Y—Ba—Cu—O ("N—YBaCuO") is then deposited across the base electrode edge at a reduced temperature of approximately 520–540° C. Again, a laser ablation vacuum deposition procedure at 100–200 m Torrs was utilized and the deposition rate was substantially reduced by limiting the laser repetition rate to 1 Hz compared to the 5 Hz that was utilized for the base electrode superconductor layer. Subsequently, the temperature of the backing plate was increased to approximately 800° C. and a superconducting counter-electrode layer of $Yba_2Cu_3O_{7-x}$ was deposited at a laser repetition rate of 5 Hz. The resulting structure was then annealed in 50–100 Torrs of oxygen at approximately 500° C. for 12 minutes. The junction was then subject to a second lithography and ion milling step to cut holes through the magnesium oxide to the base electrode and lift-off gold pads. A third lithography and ion milling process define the specific counter-electrode patterns that were desired.

This method produced a high Tc edge geometry weak link superconductor Josephson element of an SNS device structure having a weak link barrier layer within a range of approximately 5 Å to 200 Å in thickness with a base electrode and counter-electrode of approximately 1000 Å to 3500 Å in film thickness. Preferably, the weak link layer thickness is in the range of 25 Å to 100 Å with a preferred embodiment having a thickness of approximately 50 Å and an effective metal coherence length of 20 Å at a temperature of 4.2 K.

Tests have indicated that the weak link layer provided a very good SNS device with a current-voltage curve characteristic consistent with the desired RSJ model and 80–100% critical current modulation in applied magnetic fields. As can be appreciated, the weak link barrier layer may have a relative close lattice match to the superconducting YBaCuO electrodes, with a similar crystal structure, and is obviously chemically compatible with the superconductor electrodes at their growth temperature. The weak link normal metal layer grew in a two-dimensional fashion with relatively few pin holes and had a relative long coherence length with a high restivity that would suggest the capacity for appropriate scaling to 50 Ω with 0.1 μm lithography.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE INVENTION

Figure 1:
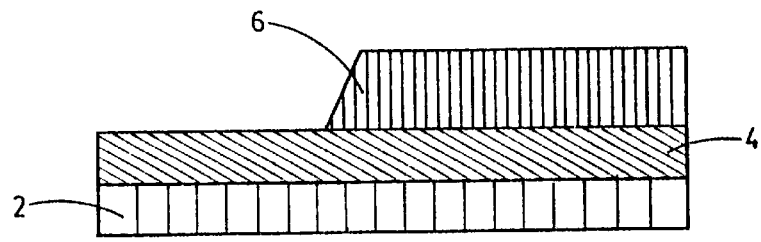
FIG. 1 is a schematic cross-sectional configuration of the structure in one step in producing the edge geometry configuration.

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a method of providing an improved SNS superconductor junction with a weak link barrier.

The present invention seeks to resolve the severe surface problems that have prevented a successful production fabrication of a high quality, high temperature superconducting junction to date by attempting to provide a highly compatible normal metal weak link layer. This goal is sought to be achieved by providing a relatively clean normal metal/superconductor interface with any damaged layers being approximately less than one coherence length ζ thick and the weak link length or thickness being within an effective length relative to the normal metal coherence length with an appropriate submicron layer cross-sectional dimension that will be adequate to achieve device impedances which are high enough to couple to external circuitry.

The present invention is achieved through the growth of an epitaxial YBaCuO/normal-metal/YBaCuO trilayer in either a sandwich or edge geometry configuration. The normal metal barrier layer N—YBaCuO is expected to have a relatively close lattice match to YBaCuO as well as a similar crystal structure so that it will provide a template for overgrowth of a counter-electrode. The thin weak link layer should further be chemically compatible with YBaCuO at the growth temperature and should be able to grow in a two-dimensional fashion with as few pin holes as possible.

The normal metal layer should have a relatively long coherence length and a high resistivity. An advantage of an edge geometry epitaxial tri-layer approach is that it allows a very short weak layer length to be achieved because the effective length is determined by the thickness of the normal metal layer.

The specific embodiments described herein were accomplished with a YBaCuO system which is in the family of rare earth-alkaline earth-cuprate superconductors. It is believed that the advantages of the present invention can be achieved with other ceramic high temperature superconductor systems, as would be expected by a person of skill in this field.

The present invention utilizes a nonsuperconducting Y—Ba—Cu—O (N—YBaCuO) weak link barrier material that is specifically grown at a reduced temperature. The choice of such a weak link barrier material has an obvious advantage of chemical compatibility with the base electrode and counter-electrode to form a high quality $YBa_2Cu_3O_{7-x}$/normal-metal/$YBa_2Cu_3O_{7-x}$ structure. It is believed that the particular choice of our normal metal weak link barrier material will encourage epitaxial overgrowth of the counter-electrode because the lattice constants reported for oxygen-deficient $YBa_2Cu_3O_{7-x}$ and for the possible cubic $YBa_2Cu_3O_{7-x}$ phase are close to those for more fully oxidized $YBa_2Cu_3O_{7-x}$.

The exact structure of the normal metal weak link barrier is not fully known and it is possible that a simple cubic perovskite structure is grown in accordance with the method of the present invention. There is difficulty in obtaining quantitive information on such very thin films grown on a small area and the experiments performed and reported herein suggest that our structure may be cubic. Another possibility is that a metastable, oxygen-rich, nonsuperconducting, tetragonal phase of $YBa_2Cu_3O_{7-x}$ may have been formed under the low temperature processing condition. For purposes of defining the present invention the procedure disclosed is sufficiently operative to reproduce the Josephson element of the present invention.

Recent theoretical results also suggest that higher resistivity materials, such as nonsuperconducting Y—Ba—Cu—O may be more suitable for obtaining high $I_cR_n$ products than low resistivity metals, such as Au or Ag.

In the preferred embodiment and method of the present invention, we have defined a particular junction configuration as an edge geometry weak link, because it is believed in the preferred embodiment that this structure offers some advantages over other possible geometry, such as the sandwich and lateral geometry devices that are known. It should be appreciated, however, that the present invention is not necessarily limited to an edge geometry, although it is believed that this is the preferred embodiment.

The basic device structure of the present invention is formed by depositing the N—YBaCuO layer and the $YBa_2Cu_3O_{7-x}$ layer counter-electrode on the exposed edge of a c-axis-oriented $YBa_2Cu_3O_{7-x}$ thin film overlaid by a thick insulator. The insulator prevents electrical contact to the top surface of the base electrode, so that the active device area is determined by the thickness of the lower $YBa_2Cu_3O_{7-x}$ film and the width of the patterned counter-electrode. This allows very small device areas to be achieved using conventional photolithography. In addition, the effective microbridge length is determined by the thickness of the deposited weak link material so that extremely short bridge lengths are possible, provided that thin, uniform layers can be grown on the $YBa_2Cu_3O_{7-x}$ edge. The edge geometry also has the advantages, that, for c-axis $YBa_2Cu_3O_{7-x}$ films, the current flow in the device active area and lead-in electrodes is along the high current density a-b planes, and that the critical normal-superconductor device interfaces are located on the longer coherence length surfaces perpendicular to the a-b planes.

The growth conditions for the superconducting and non-superconducting YBaCuO thin films used in the method of production were nominally identical except for the substrate temperature and the deposition rate. Each of the Y—Ba—Cu—O films were deposited by pulsed excimer laser ablation of a target source at 248 nm and an energy density of approximately 1 J/cm². The stoichiometry of our target source was 1:2:3:7 Y:Ba:Cu:O. The oxygen pressure during deposition was within the range of 100 to 200 m Torrs and preferably at 200 m Torrs, and the deposition rate was 1–2 Å/pulse.

The thin weak link N—YBaCuO layer was typically grown at a laser repetition rate of 1 Hz, while the thicker superconducting electrode layers were grown at 5–10 Hz. The backing plate temperature during growth of the nonsuperconducting YBaCuO films was approximately 520–540° C., and about 790–830° C. during growth of the base and counter-electrode superconducting layers. In productionr the YBaCuo weak link barrier deposition was immediately followed by a higher growth temperature for depositing the counter-electrode, and the deposited layers were then annealed in 50–100 Torrs of oxygen at approximately 500° C. for 12 minutes. This annealing procedure was also used after the depositing of the base electrode films. Typical film thicknesses are 25 Å to 100 Å for the N—YBaCuO, and 1500–3000 Å for the superconducting electrodes.

Figure 2:
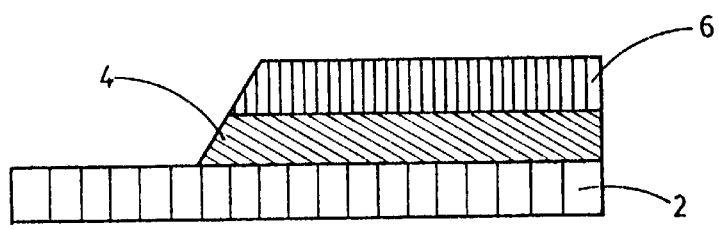
FIG. 2 is a schematic cross-sectional configuration illustrating an interim configuration of the structure.

The preferred edge-geometry device fabrication process of the present invention avoids the use of shadow masks in favor of standard integrated circuit processing techniques, which should be readily extendable to more complex circuits. The basic processing steps are briefly outlined here with schematic side and top views of a competed device shown in FIG. 1 through 5. The fabrication process begins with the deposition of the $YBa_2Cu_3O_{7-x}$ base electrode film on a substrate, such as a properly cleaned and prepared $SrTiO_3$ (100) or $LaAlO_3$ (100) substrate. This is followed by the annealing step. Subsequently, a thick MgO film is patterned by photolithography and liftoff, as shown in FIG. 1. The MgO layer is utilized as an ion milling mask to define a self-aligned edge in the base electrode using 500 eV Ar ions, followed by a brief 50 eV Ar ion edge cleaning, see FIG. 2. In some cases, the ion-milling edge cutting process is done at non-normal incidence to produce a more tapered YBaCuO base electrode edge.

Figure 3:
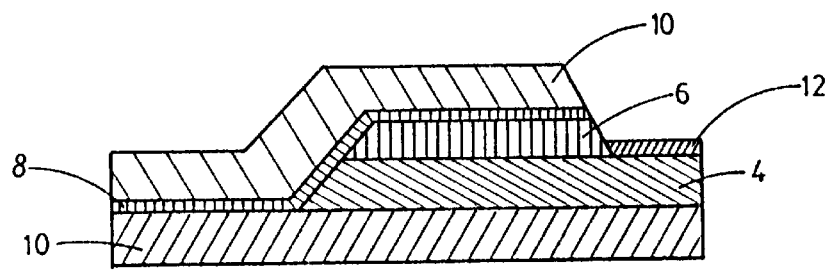
FIG. 3 is a schematic cross-sectional configuration showing another interim configuration of the structure.
Figure 4:
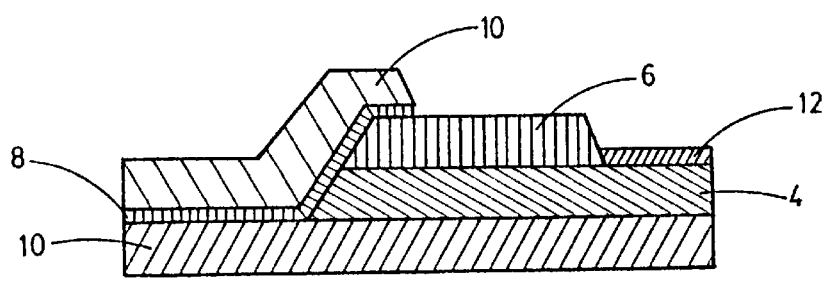
FIG. 4 is a schematic cross-sectional configuration showing the final configuration of the structure.
Figure 5:
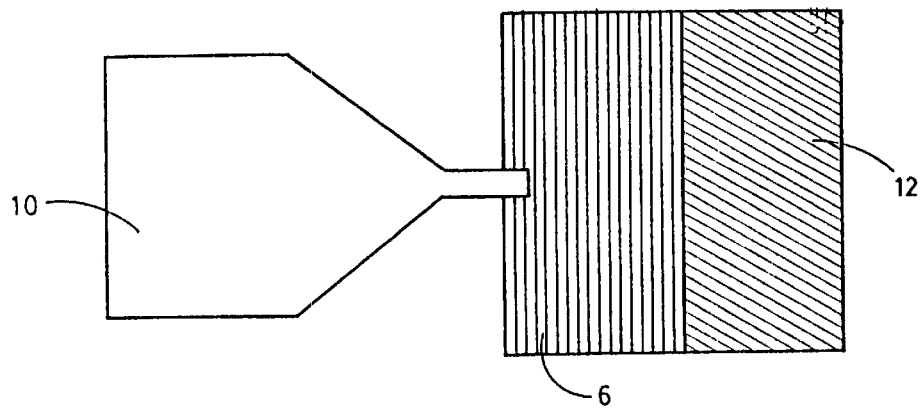
FIG. 5 is a plan view of the final configuration of the completed edge geometry weak link superconductor of the present invention.

Immediately after this step, within the same vacuum system, the substrate temperature is increased and the N—YBaCuO barrier layer 8 and $YBa_2Cu_3O_{7-x}$ counterelectrode 10 are deposited. After annealing, a second lithography and ion milling step is used to cut via holes through the MgO to the base electrode and liftoff Au 12 pads, as shown in FIG. 3. Finally, a third lithography and ion milling process defines the counter-electrode patterns that can be seen in FIGS. 4 and 5.

Figure 6:
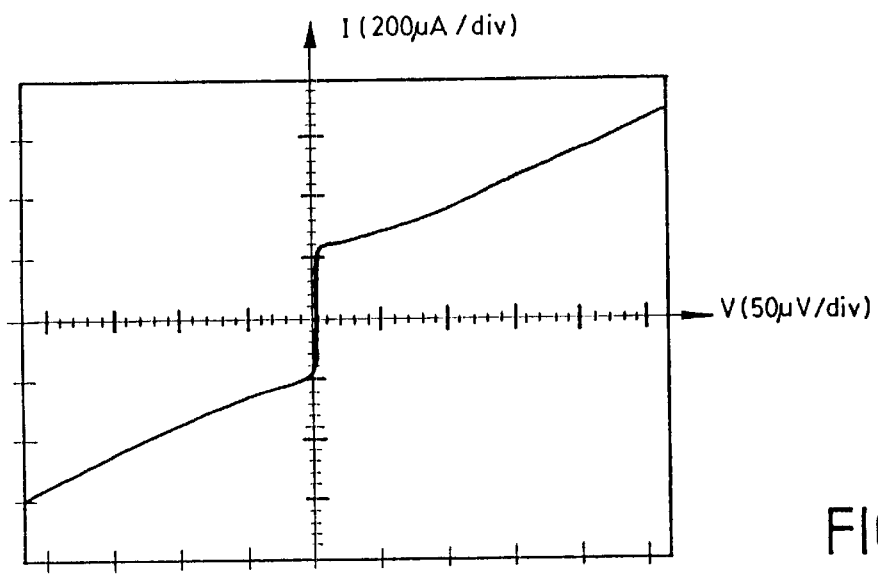
FIG. 6 is a graph of the current-voltage characteristics at 61.5 K of a 50 Å thick weak link barrier of the present invention.

The best results were obtained with edge-geometry weak links having 50 Å thick N—YBaCuO barrier layer at temperatures above 50 K. A typical I-V characteristic at 61.5 K for such a device is shown in FIG. 6. The I-V curve is qualitatively consistent with the RSJ model, unlike the piecewise-linear or flux-flow characteristics often observed with other all-high $T_c$ weak links. This particular weak link had a current density of 6.5 kA/cm$^2$ and an $I_c R_n$ product of 105 $\mu$V at this temperature. While at 4.2 K, the $I_c R_n$ products are not as large as theoretically possible, it is believed that larger $I_c R_n$ values may result from improvements in counter-electrode overgrowth. The resistance of this 11 $\mu$m×0.28 $\mu$m device is =0.5 $\Omega$ and it is believed that 5 $\Omega$ device resistances should be achievable with 1 $\mu$m lithography, and 50 $\Omega$ with 0.1 $\mu$m lithography.

Figure 7:
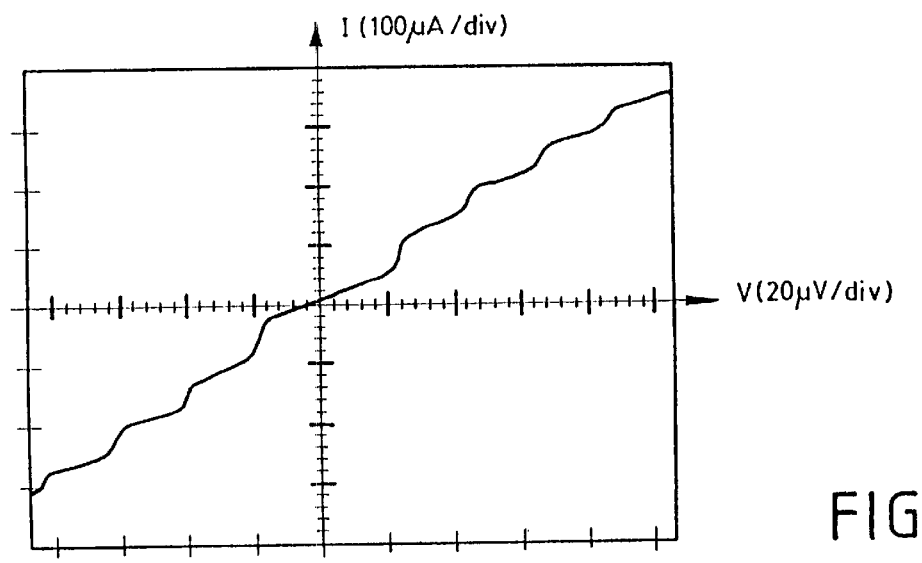
FIG. 7 is a voltage versus wavelength graph of Josephson steps under 10 GHz microwave irradiation.

As shown in FIG. 7, this invention exhibited strong microwave response, with ac Josephson steps at the expected voltages ($V_n$=nhv/2e) under 10 GHz microwave irradiation. The microwave step amplitudes showed Bessel-function-like oscillatory behavior with increasing RF field, qualitatively consistent with an RSJ current source model. At 4.2 K the 50 Å barrier devices had current densities of about 10$^5$ A/cm$^2$, but showed less ideal device characteristics, with flux-flow-type I-V curves and weak microwave response. The non-ideal 1-V characteristics in this case may be due to self-shielding effects related to the small Josephson penetration depth ($\lambda_J$) in these high $J_c$, relative wide junctions.

Devices with 25 Å and 100 Å thick N—Ba—Cu—O weak link barrier layers were also tested. At 4.2 K and higher temperatures the weak links with 100 Å barriers sometimes exhibited RSJ-like I-V characteristics, but many of the devices had non-ideal piecewise-linear I-V curves. Some of these devices showed ac Josephson steps which modulated completely with increasing RF power, but typically the magnetic field modulation of the critical currents was less then 30%. The 25 Å barriers devices often showed RSJ I-V characteristics at higher temperatures with strong microwave response up to ~85 K. However, these weak links also showed incomplete (<70%) magnetic field modulation and exhibited hysteresis and switching noise at low voltages, which may be related to switching of weak spots or pin holes in these very thin barriers. In contrast to the 25 and 100 Å barrier devices, above 50 K the 50 Å barrier weak links typically showed 80–100% critical current modulation in applied magnetic fields. The $I_c$ vs B data for such devices exhibited diffraction patterns approximating the expected Fraunhofer behavior, with a strong central peak and periodic $I_c$ modulation, but some asymmetry in the pattern, indicating fairly good barrier uniformity. In these preliminary magnetic field measurements, the field was not applied parallel to the junction base electrode edge, so quantitative determination of the effective device area was not possible.

Figure 8:
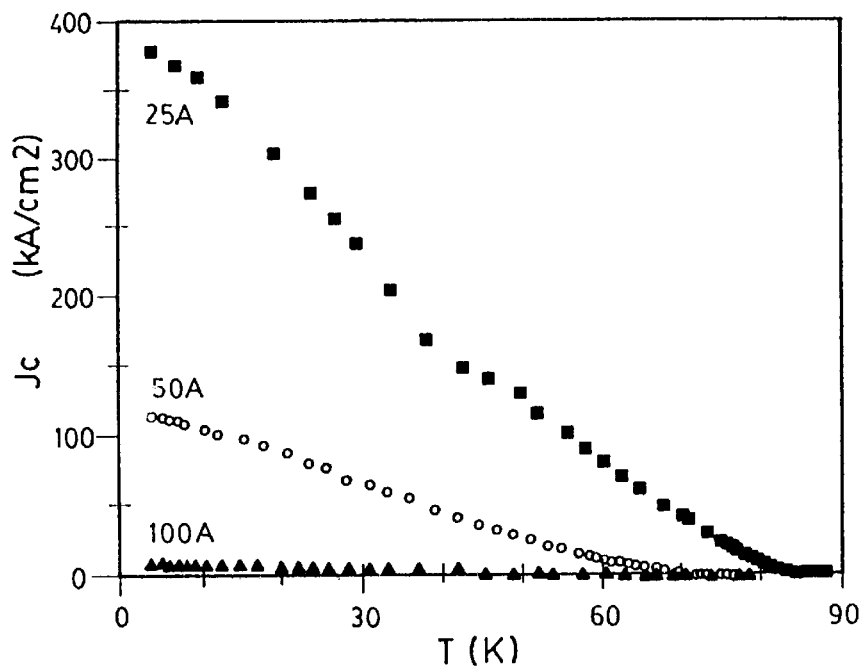
FIG. 8 is a comparison graph of Jc versus temperature curve for three weak link barrier thicknesses.
Figure 9:
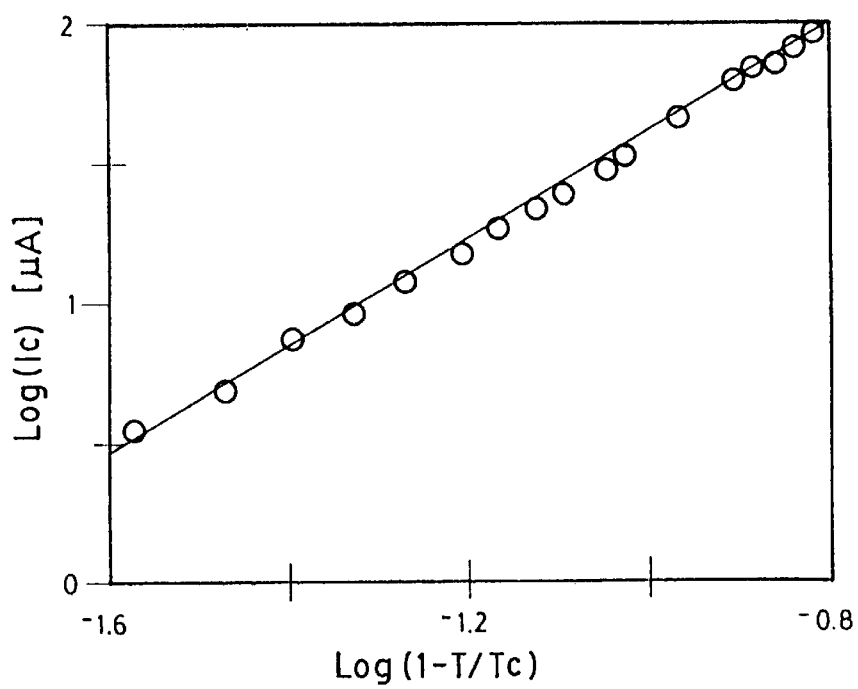
FIG. 9 is a graph of the log relationship of current versus temperature for a 50 Å weak link barrier.
Figure 13:
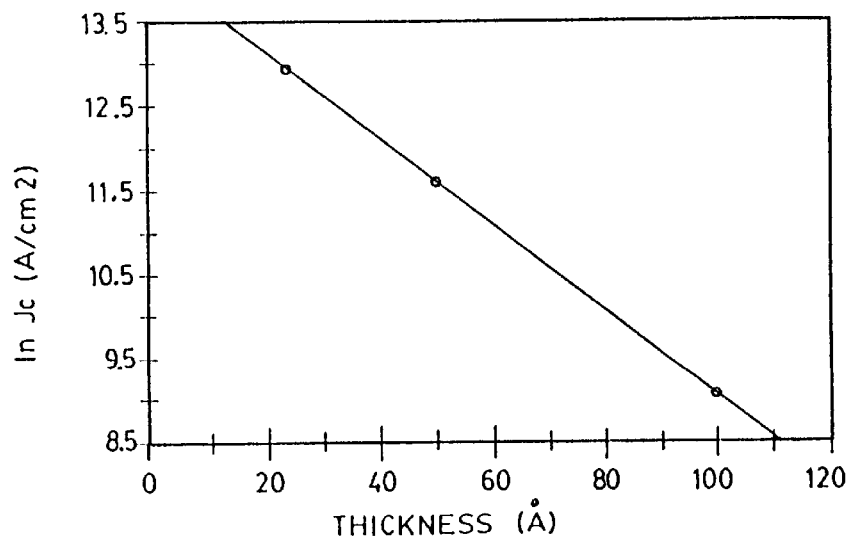
FIG. 13 is a graph comparison of in (Jc) versus weak link barrier thickness.

Another important indicator of the uniformity of the N—YBaCuo barrier layers is the scaling behavior of the critical current and device resistance with barrier thickness and device area. See FIG. 13 for a plot of ln(Jc) as a function of N—YsaCuO normal metal thickness at 4.2 K. The linear data fit indicates that $J_c$ is proportional to exp($-L/\xi_n$), where to $\xi_n$=20 Å is the normal metal coherence length. Such exponential scaling of $J_c$ with the normal metal weak link barrier thickness is predicted by simple theories of SNS behavior. The temperature dependence of the critical current density for devices with 25, 50, and 100 Å barrier thicknesses is shown in FIGS. 8 and 9. The qualitative shape of the $J_c$ vs T curves is similar for all three barrier thicknesses, and a fit of the data for the 50 Å barrier device, see FIG. 9, indicates that $I_c$ goes as $(1-T/T_c)^2$ near $T_c$ as predicted by basic theories for SNS devices. FIG. 8 clearly shows the strong dependence of critical current on barrier thickness with $J_c$ at 4.2 K ranging from 8.3×10$^3$ A/cm$^2$ for the 100 Å barrier, to 3.8×10$^5$ A/cm$^2$ for the 25 Å barrier. These devices also show resistances which scale inversely with the device area, and average $R_n$A products at 4.2 K for the 25, 50, and 100 Å barrier thicknesses are 2.7×10$^{-9}$, 7.7×10$^{-9}$, and 1.2×10$^{-8}$ $\Omega$-cm$^2$, respectively. The scaling of $J_c$ and $R_n$ with barrier thickness and device area indicates that the N—YBaCuO weak link barrier layers are indeed relatively uniform, and that the device behavior is not dominated by pin hole conduction. In contrast to the lateral resistivity measurements of N—YBaCuO films on LaAIO$_3$ substrates, preliminary tests show a factor of 2–3 decrease in device resistance as the temperature is lowered from ≈80 K to 4.2 K. However, the magnitudes of the device $R_n$A products are consistent with the low end of the resistivity range seen in lateral transport experiments.

In summary, high quality, all-high $T_c$ edge-geometry weak links have been fabricated using nonsuperconducting N—YBaCuO barrier weak link layers in a production process with excellent yields. The best results were obtained with devices incorporating 50 Å barrier layers, which show RSJ-like I-V characteristics with strong ac and dc Josephson effects. The scaling behavior of $J_c$ and $R_n$ with barrier thickness and area indicates that the N—YBaCuO barrier layers form uniform, high quality weak links with an effective normal metal coherence length of 20 Å at 4.2 K.

In an effort to further define the structure of the specific superconducting electrodes and weak link barrier layer, the results of X-ray photoelectron spectroscopy (XPS) measurements are presented.

Each of the film layer specimens were immersed for 30–60 seconds in 1% Br$_2$ in absolute ethanol, followed by rinsing in ethanol and blow drying with nitrogen. The XPS spectra were accumulated at room temperature on a Surface science Instruments SSX100-501 spectrometer with monochromatized Al K$_\alpha$ X-rays (1486.6 eV) and a base pressure <3×10$^{-20}$ Torrs and a typical operating pressure of 4–6×10$^{-10}$ Torrs. For these experiments, an X-ray spot size of 600 $\mu$m and an analyzer pass energy of 25 eV are used, yielding a peak full width at half maximum (FWHM) of 0.7 eV measured for the Au 4f$_{7/2}$ peak from an evaporated Au film. For the measurements presented here, the standard sample mount for this spectrometer has been replaced by a custom mount which allowed variable angle measurement. Since the photoelectron energy analyzer has a solid angel of acceptance of 30°, these data should be viewed as angle-integrated measurements centered at the specified angle, rather than as angle-resolved measurements.

Figure 10:
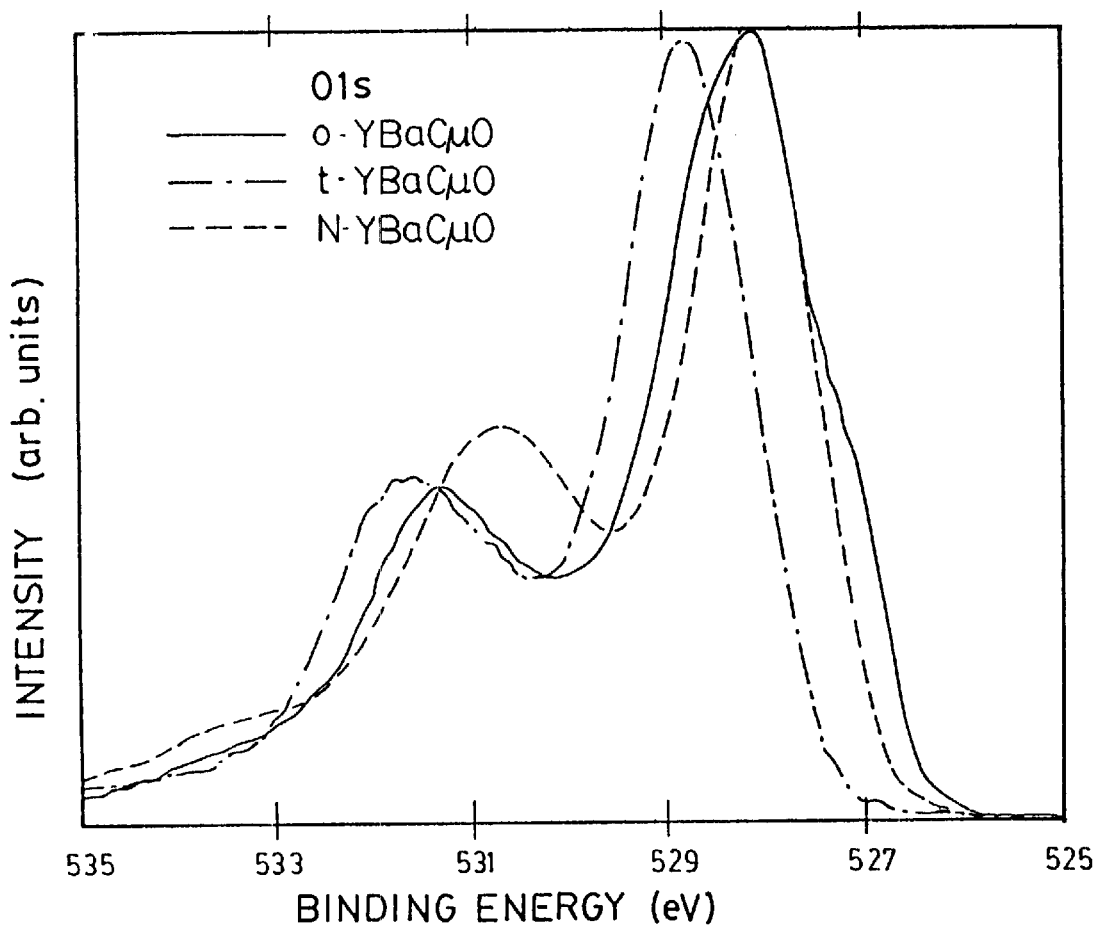
FIG. 10 is a graph of Intensity vs Binding Energy for O 1 s spectra.

The O 1s spectra measured from orthorhombic YBaCuO, Tetragonal YBaCuO, and the N—YBaCuO weak link film were compared in FIG. 10. All three spectra exhibited peaks at higher binding energy associated with residual nonsuperconducting surface species, which will not be considered here. The lower binding energy peaks in the t-YBaCuO and N—YBaCuO spectra are narrower than that of o-YBaCuO, and the t-YBaCuO peak is shifted to higher binding energy. The o-YBaCuO spectrum had a clear shoulder on the low binding energy side of the main peak and a less obvious shoulder on the high binding energy side which is evident when comparison is made to the N—YBaCuO, which can be fitted with a single peak.

Figure 11:
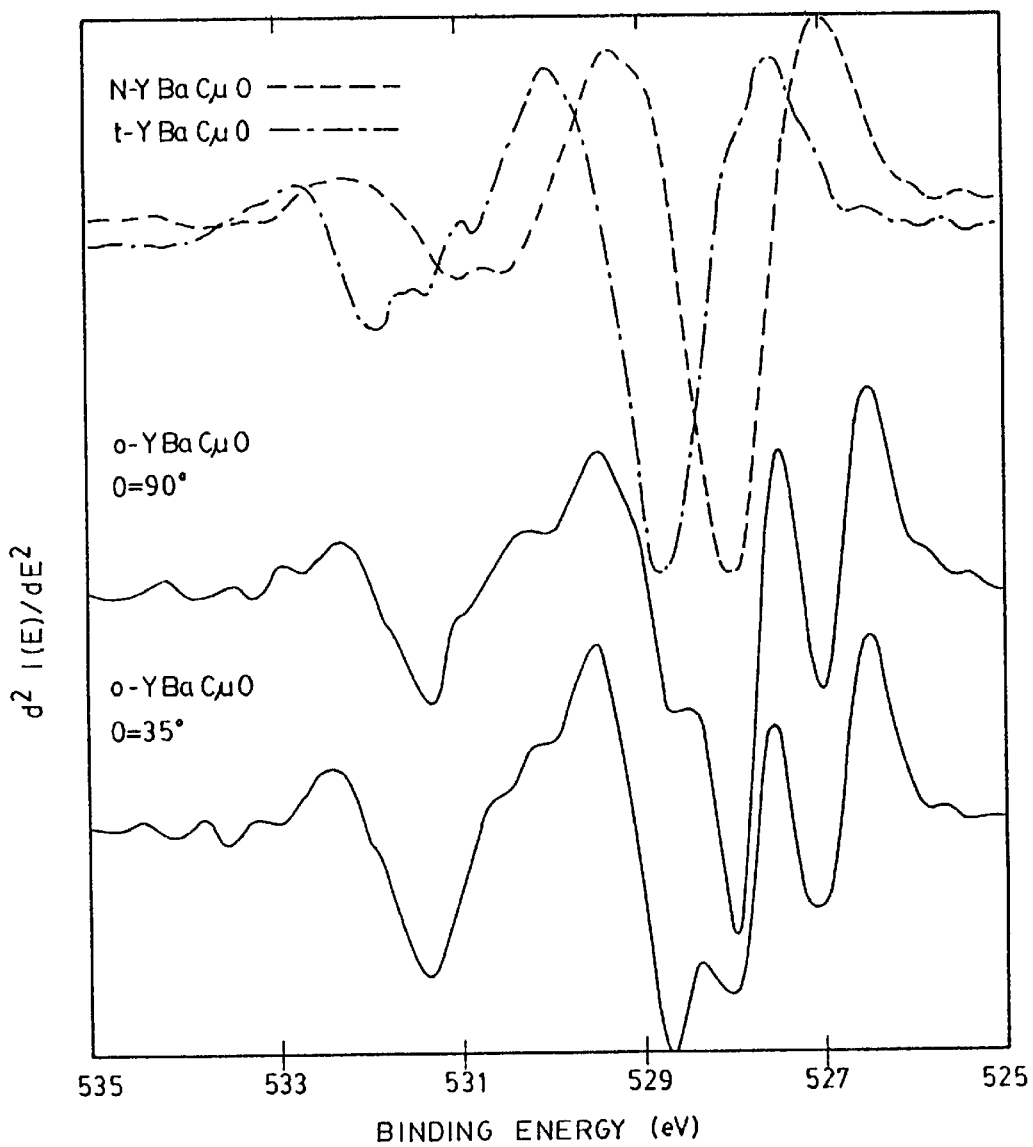
FIG. 11 is a graph comparison of the second derivatives of the spectra of FIG. 10.

The second derivatives, in which peak positions appear as troughs and weak structure is enhanced, of the spectra from FIG. 10 are shown in the top three curves in FIG. 11. These data confirm that the t-YBaCuO and N—YBaCuO spectra consist of single peaks at 528.8 eV and 528.1 eV, respectively, and the previously unresolved three peaks comprising the o-YBaCuO spectrum now appear as well-resolved components. The peaks at 527.1 and 528.0 eV are believed to be intrinsic to o-YBaCuO, corresponding to Cu—O chains and Cu—O planes, respectively. The peak at 528.7 eV is surface related, evident in its enhanced relative intensity at grazing angles (compare the bottom two curves in FIG. 11). The occurrence of this peak at the same position as that of t-YBaCuO suggests that it may correspond to some residual t-YBaCuO due to incomplete oxidation or oxygen loss at the surface in vacuum. However, no other spectral features associated with t-YBaCuO were observed. As subsequently discussed, a possible origin of this peak is reconstruction of the Cu—O planes which terminate chemically-etched o-YBaCuO surfaces. The absence of this feature and the peak associated with Cu—O chains in the N—YBaCuO may indicate a simple perovskite crystal structure in which Cu—O planes and chains do not exist.

Within experimental error, the Cu 2p core level and Cu LMM Auger signals for N—YBaCuO are identical to those for o-YBaCuO. The intensity of the satellite peak in the Cu 2p spectrum, characteristic of Cu in the +2 oxidation state was 43% of the intensity of the main peak for both o-YBaCuO and N—YBaCuO, while it is 0.29 for t-YBaCuO, and the $Cu^{+1}$ signal evident in t-YBaCuO is absent in N—YBaCuO. This observation suggests that N—YBaCuO is not simply an oxygen deficient YBaCuO. The other core level signals from N—YBaCuO are also very similar to those from o-YBaCuO. The Y $3d_{5/2}$ is observed at 155.8 eV, 155.9 eV, and 156.4 eV for o-YBaCuO, N—YBaCuO, and t-YBaCuO, respectively, and the corresponding Ba $3d_{5/2}$ ($4d_{5/2}$) peaks were observed at 777.6 eV (87.2 eV), 777.8 eV (87.4 eV) and 778.6 eV (88.2 eV), respectively. The Ba MNN Auger signals from N—YBaCuO and o-YBaCuO are identical within experimental error. These data imply that the potentials at the Y, Ba, and Cu sites may be similar in o-YBaCuO and N—YBaCuO.

Figure 12:
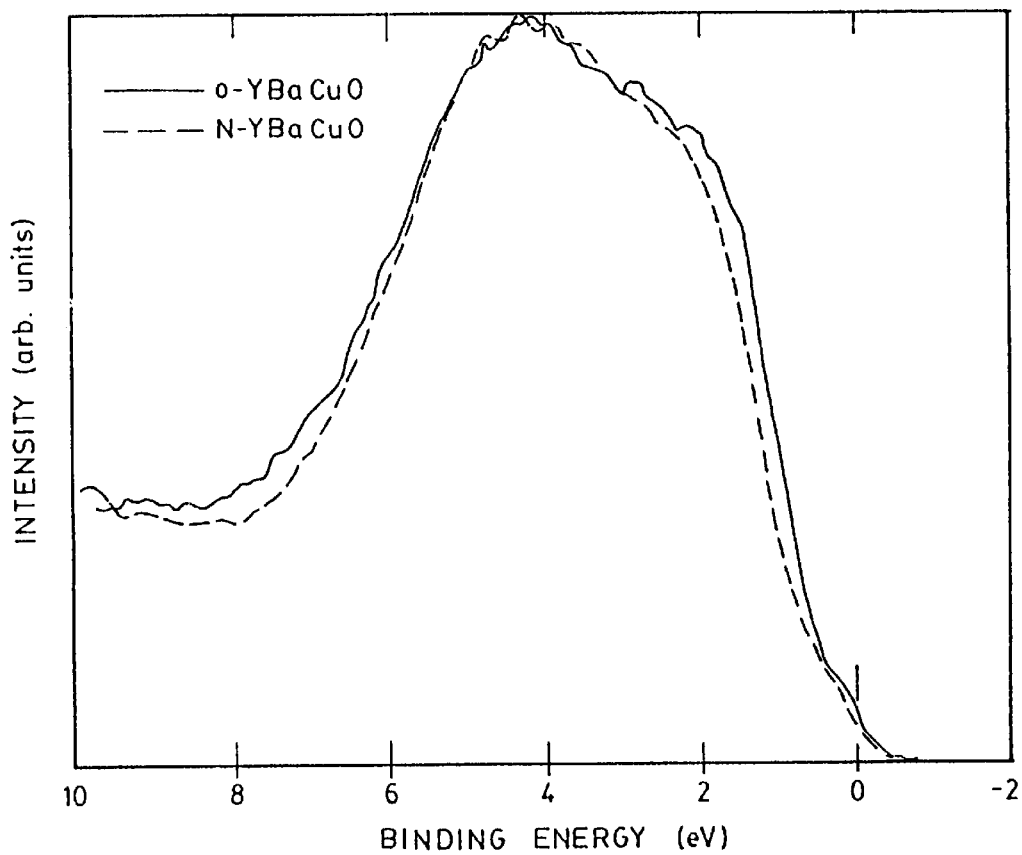
FIG. 12 is a graph comparison of the valence bands measured at normal emission.

The overall shape of the valence band spectrum from N—YBaCuO is similar to that from o-YBaCuO, as shown in FIG. 12, but is slightly narrower, primarily on the low binding energy side, and with less intensity at the Fermi level. A Fermi edge is evident in the o-YBaCuO spectrum, reflecting the normal state metallic conductivity and providing evidence of a high quality surface. The valence band spectrum from t-YBaCuO differs significantly from the spectra in FIG. 12, in having negligible intensity at the Fermi level and also significantly different features. The lower intensity in the N—YBaCuO spectrum in the 0–2 eV range is consistent with a lack of Cu 3d-O 2p π-bonding states from Cu—O chains, and is thus consistent with expectations from a possible simple perovskite crystal structure.

In summary, XPS characterization of a nonsuperconducting N—YBaCuO SNS weak link barrier material shows that the spectral features are distinct from those of the o-YBaCuO and t-YBaCuO phases, especially in the O 1s region. Features associated with Cu—O chains and surface-reconstructed Cu—O planes are absent in the N—YBaCuO spectra, consistent with a possible, simple perovskite crystal structure.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

I claim:

1. A method of producing a high temperature superconductor Josephson element comprising the steps of:
   providing a substrate;
   depositing a lower superconducting electrode film layer of YBaCuO on the substrate;
   depositing a weak link barrier layer of a nonsuperconducting film of N—YBaCuO on the lower film layer, and
   depositing an upper superconducting counter-electrode film layer of YBaCuO on the barrier layer.

2. The method of claim 1 wherein the lower superconducting film layer has an exposed edge of a c-axis oriented $YBa_2Cu_3O_{7-x}$ film layer and the weak link barrier layer of nonsuperconducting film is deposited over the exposed edge.

3. The method of claim 1 wherein the lower electrode superconducting film and upper electrode superconducting film are deposited at approximately a temperature range of 790° C. to 830° C. and the nonsuperconducting film is deposited at a temperature range of 520° C. to 540° C. in 100 to 200 m Torrs of oxygen.

4. The method of claim 1 wherein the weak link barrier layer is deposited to form a layer thickness within a range of 25 Å to 100 Å.

5. The method of claim 1 wherein the respective lower and upper superconducting film layers are deposited to form film thicknesses within the range of 1000 Å to 3500 Å.

6. The method of claim 1 wherein the formation of the respective layers occurred in a deposition step with an oxygen pressure of 100 to 200 m Torrs.

7. The method of claim 1 wherein the formation of the respective film layers occurred by exposing a $YBa_2Cu_3O_{7-x}$ target to a pulsed excimer laser at 248 mm and an energy density of 1 to 2 $J/cm^2$.

8. The method of claim 7 wherein the formation of the respective film layers occurred by depositing the lower and upper superconducting film layer at a deposition rate of approximately 1–2 Å/pulse at a pulse rate of 5–10 Hz and the barrier layer at a deposition rate of approximately 1–2 Å/pulse rate of 1 Hz.

9. The method of claim 8 wherein the weak link barrier layer has a thickness of approximately 5 Å to 200 Å.

10. The method of claim 1 wherein the weak link barrier layer is deposited to form a layer thickness of 50 Å.

11. The method of claim 1 further including the step of providing a clean normal metal/superconductor interface between said lower layer and said barrier layer with any damage to said lower layer being approximately less than one coherence length thick.

12. A method of producing a high temperature superconductor Josephson junction comprising the steps of:
   providing a substrate;
   depositing a lower superconducting electrode film layer of YBaCuO on the substrate;
   depositing a weak link barrier layer of a nonsuperconducting film of N—YBaCuO on the lower film layer to form a layer having a thickness within a range of 5 Å to 200 Å; and
   depositing an upper superconducting counter-electrode film layer of YbaCuO on the barrier layer;
   wherein the lower electrode superconducting film and upper electrode superconducting film are deposited at a temperature range of 790° C. to 830° C. and the nonsuperconducting barrier layer is deposited at a temperature range of 520°; to 540° C.;
   wherein the formation of each of the respective lower, barrier, and upper layers occurs in a deposition step with an oxygen pressure of 100 to 200 m Torrs; and
   wherein the formation of the respective upper, lower, and barrier film layers is achieved by exposing a $YBa_2Cu_3O_{7-x}$ target to a pulsed excimer laser and depositing the lower and upper superconducting films layer at a deposition rate of approximately 1–2 Å/pulse at a pulse rate of 5–10 Hz and the barrier layer at a deposition rate of approximately 1–2 Å/pulse at a pulse rate of 1 Hz.

13. The method of claim 12 wherein the thickness of the weak link barrier is 50 Å.

14. The method of claim 12 further including the step of providing a clean normal metal/superconductor interface between said lower layer and said barrier layer with any damage to said lower layer being approximately less than one coherence length thick.

15. The method of claim 12 wherein the lower superconducting film layer has an exposed edge of a c-axis oriented $YBa_2Cu_3O_{7-x}$ film layer and the weak link barrier layer of nonsuperconducting film is deposited over the exposed edge.

16. A method of producing a high temperature superconductor Josephson junction comprising the steps of:

providing a substrate;

depositing a lower superconducting electrode film layer of YBaCuO on the substrate;

depositing a weak link barrier layer comprising a nonsuperconducting film of N—YBaCuO on the lower film layer; and depositing an upper superconducting counter-electrode film layer of YBaCuO on the barrier layer.

17. The method of claim 16 wherein the lower electrode superconducting film and upper electrode superconducting film are deposited at approximately a temperature range of 790° C. to 830° C. and the nonsuperconducting film is deposited at a temperature range of 520° C. to 540° C. in 100 to 200 m Torrs of oxygen.

18. The method of claim 17 wherein the weak link barrier layer is deposited to form a layer thickness of 50 Å.

19. A method of producing a SNS high temperature superconductor Josephson junction comprising the steps of:

providing a substrate;

depositing a lower superconducting electrode film layer of YBaCuO on the substrate;

depositing a weak link barrier layer comprising a nonsuperconducting film of YBaCuO on the lower film layer; and depositing an upper superconducting counter-electrode film layer of YBaCuO on the barrier layer.

20. The method of claim 19 wherein the lower electrode superconducting film and upper electrode superconducting film are deposited at approximately a temperature range of 790° C. to 830° C. and the nonsuperconducting film is deposited at a temperature range of 520° C. to 540° C. in 100 to 200 m Torrs of oxygen.

21. The method of claim 20 wherein the weak link barrier layer is deposited to form a layer thickness of 50 Å.

22. The method of claim 17 wherein the formation of the upper and lower superconducting films occurs in a deposition step with an oxygen pressure of 100 to 200 m Torrs.

23. The method of claim 20 wherein the formation of the upper and lower superconducting films occurs in a deposition step with an oxygen pressure of 100 to 200 m Torrs.

24. The method of claim 22 wherein the Y—Ba—Cu—O barrier deposition is immediately followed by a ramp to the higher growth temperature, the counter-electrode is then deposited, and the upper, lower and barrier layers are then annealed in 50 Torrs of oxygen at 500° C. for 12 minutes.

25. The method of claim 23 wherein the Y—Ba—Cu—O barrier deposition is immediately followed by a ramp to the higher growth temperature, the counter-electrode is then deposited, and the upper, lower and barrier layers are then annealed in 50 Torrs of oxygen at ≈500° C. for 12 minutes.

26. The method of claim 22 wherein the lower superconducting film layer has an exposed edge of a c-axis oriented $YBa_2Cu_3O_{7-x}$ film layer and the weak link barrier layer of nonsuperconducting film is deposited over the exposed edge.

27. The method of claim 23 wherein the lower superconducting film layer has an exposed edge of a c-axis oriented $YBa_2Cu_3O_{7-x}$ film layer and the weak link barrier layer of nonsuperconducting film is deposited over the exposed edge.

* * * * *